United States Patent
Ihantola

(10) Patent No.: US 6,174,366 B1
(45) Date of Patent: Jan. 16, 2001

(54) APPARATUS AND METHOD FOR PROCESSING OF SEMICONDUCTORS, SUCH AS SILICON CHIPS

(76) Inventor: Heikki Ihantola, Kenttakuja, Halikko FIN 24910 (FI)

( * ) Notice: Under 35 U.S.C. 154(b), the term of this patent shall be extended for 0 days.

(21) Appl. No.: 08/652,506

(22) PCT Filed: Dec. 20, 1994

(86) PCT No.: PCT/FI94/00574

§ 371 Date: May 31, 1996

§ 102(e) Date: May 31, 1996

(87) PCT Pub. No.: WO95/18459

PCT Pub. Date: Jul. 6, 1995

(30) Foreign Application Priority Data

Dec. 23, 1993 (FI) .......................................... 935854

(51) Int. Cl.[7] .................................................. C23C 16/00
(52) U.S. Cl. .................. 117/84; 427/255.5; 427/255.7; 438/706; 438/716; 438/719; 156/345; 118/719; 118/729
(58) Field of Search .................................. 118/719, 729; 427/255.5, 255.7; 438/706, 716, 719; 156/345 PC; 117/84

(56) References Cited

U.S. PATENT DOCUMENTS

| | | |
|---|---|---|
| 4,539,934 | 9/1985 | Fujiyama et al. . |
| 4,545,328 | 10/1985 | Fujiyama et al. . |
| 4,725,204 | 2/1988 | Powell . |
| 4,951,601 | 8/1990 | Maydan et al. . |
| 5,013,385 | 5/1991 | Maher et al. . |
| 5,174,827 | 12/1992 | Misiano et al. . |

FOREIGN PATENT DOCUMENTS

| | | |
|---|---|---|
| 0410504 | 1/1991 | (EP) . |
| 2-129100 | 5/1990 | (JP) . |
| 3-135022 | 10/1991 | (JP) . |
| 5-144754 | 6/1993 | (JP) . |

Primary Examiner—Richard Bueker
(74) Attorney, Agent, or Firm—Nixon & Vanderhye P.C.

(57) ABSTRACT

Semi-conductors, such as silicon wafers, are processed in two or more different reactors, e.g. reactors for the epitaxial growth of silicon, plasma etching, and/or vacuum metal deposition. The system is kept under constant vacuum. Common vacuum equipment, and a common gas distribution system, and a common silicon wafer loading chamber, are provided. A single reactor is maintained active at one time, while the dormant reactors are preferably kept under vacuum, and a control unit controls gas valves to selectively connect or disconnect each reactor to or from a source of treatment gas.

20 Claims, 2 Drawing Sheets

APPARATUS AND METHOD FOR PROCESSING OF SEMICONDUCTORS, SUCH AS SILICON CHIPS

CROSS REFERENCE TO RELATED APPLICATION

This application is the U.S. national phase of PCT/FI94/00574 filed Dec. 20, 1994.

BACKGROUND AND SUMMARY OF THE INVENTION

The object of the present invention is an apparatus used for processing silicon wafers, the apparatus comprising two or more reactors of essentially different type with respect to each other, the reactors being suitable for processing the various processing stages of silicon wafers, such as the epitaxial growth of silicon, plasma etching or metal deposition under vacuum, that is, for processing silicon wafers in two or more essentially different processing stages. The invention also relates to a method for processing silicon wafers in an apparatus comprising two or more reactors of essentially different type with respect to each other, for two or more essentially different types of processing of silicon wafers taking place in succession, such as the epitaxial growth of silicon, plasma etching or metal deposition.

Semiconductor technology has advanced considerably during the past three decades. The production of single transistors has been replaced by the processing of silicon wafers. One of the most significant recent developments in silicon technology has been the reduction in element dimensions which has made it possible to pack several million transistors in one circuit. At the same time, the size of silicon wafers has increased from a few centimeters up to 20 cm, which means that a considerably greater number of more efficient circuits can now be fitted on a single wafer.

In currently known furnaces or reactors intended for processing silicon wafers with a view to mass production, several dozen, or even a few hundred wafers can be processed simultaneously. To meet the continually growing commercial demand for silicon wafers, so-called cluster-type processing systems have been developed, in which several completely independent reactors used for typically similar processing of silicon wafers are connected around one common silicon wafer loading chamber. In this way it has been possible to increase the production of silicon wafers considerably.

The American patent no. U.S. Pat No. 4,951,601, for example, discloses a silicon wafer processing system which enables several different silicon wafers to be handled simultaneously at different processing stages. The system comprises several reactors to be used in the different phases of processing silicon wafers, the reactors being arranged in a cluster-like fashion around a common silicon wafer loading chamber. In this system, the silicon wafers are conveyed through the loading chamber, from one reactor to another, that is, from one processing stage to another. All the reactors operate simultaneously, and thus each is equipped with its own vacuum system and gas feed and control system as required by each process, to establish the required different conditions in each reactor.

The price of semiconductor processing apparatus has always been high. As the requirements for the accuracy and stability of temperatures have become more stringent, the prices have risen even further and are now beyond the means of ordinary universities and many research institutes.

To be able to give students at least some idea of the processes, a general solution has been to acquire used equipment suitable for handling small-diameter wafers and to lower the standard of the experiments. In this case, the apparatus of each processing stage thus typically forms a complete unit of its own, including a reaction chamber, its own separate automation, its own separate vacuum and heating equipment and gas distribution pipelines and valves. The number of pieces of equipment is thus considerable and the cost of the total equipment high. Such large equipment entities also require considerable clean room space in teaching or research institutes. The aim of the present invention is, therefore, to provide an apparatus intended for processing semiconductors, especially silicon wafers, where the above drawbacks have been minimized.

The aim of the invention is more particularly to achieve a compact apparatus, versatile in use and reasonable in price, for processing silicon wafers, especially for teaching and research purposes.

In order to achieve the above aims, the apparatus and method relating to the invention for processing semiconductors, particularly silicon wafers, are characterized by what is specified in the claims below.

In the apparatus used for processing silicon wafers according to a preferred embodiment of the invention, two or more reactors of essentially different types are connected to a common central unit which controls the functions of the apparatus. The reactors operate in succession, so that while one reactor is in operation, the others are at a waiting stage. Each reactor is typically used when it is operating in different conditions, for example, in a different pressure range, at a different temperature or in a different gaseous atmosphere than another reactor operating at a different time.

In the apparatus relating to the invention, the central unit comprises, for example, vacuum equipment common to all reactors, such as a vacuum pump and/or a turbo pump, to which the reactors are connected by means of vacuum valves that can be closed separately. During the waiting stage, a high vacuum is created in the reactors and the reactors are cut off from the system by valves. In the operating reactor the pressure is increased to the suitable level.

The central unit also includes a gas distribution and control system common to all the reactors. The reactors are connected to the gas distribution system by gas valves which can be closed and controlled separately, by means of which valves the reactors at the waiting stage at a given time can be cut off from the system, and by means of which the feeding of gas to the reactor activated at any given time can be controlled. For example the following gases are used in processing silicon wafers: gas containing oxygen, nitrogen, hydrogen, silane, arsine and/or phosphine. Gas pipelines are provided separately for each gas, the pipelines being connected to that reactor or those reactors which use the gas in question. The flow of gases is controlled by a common gas control system.

The central unit preferably also includes an electricity distribution system common to the reactors, and a common high-frequency alternator. In addition, the reactors preferably have a common silicon wafer loading chamber, through which the silicon wafer is transferred to the reactor desired at a given time. The loading chamber is preferably connected to the vacuum equipment of the central unit to create a negative pressure or vacuum also in the loading chamber. The negative pressure reduces to a substantial degree the mixing of different gas spaces in the system.

In applying the method relating to the invention, one or possibly several, silicon wafers are processed in only one active reactor at a time, the reactor active at a given time being connected to a common vacuum pump system and the other reactors being cut off from it, that is, at the waiting stage. The gas required for each processing of the silicon wafer—such as gas containing oxygen, nitrogen, hydrogen, silane, arsine and/or phosphine—is conducted, by controlling the common control equipment, only to the reactor active at a given time. During the waiting stage the other reactors are kept under a high vacuum, preferably under a vacuum of about 10–100 Pa.

When the development of the processing of silicon wafers in recent years is reviewed, the dimensions of integrated circuit elements nearing the $\mu$m limit, it may be noted that long heat treatments lasting for hours at temperatures ranging between 1000–1200° C. are no longer required. The temperatures used are lower and processing times shorter and, therefore, from the point of view of use of time it is often not important to be able to process several silicon wafers simultaneously, but they can be produced in smaller reactors intended for only one silicon wafer, one wafer at a time.

Other substantial changes relating to the processing of silicon wafers have also taken place. Etching in acids has for the most part been abandoned. Etching now often takes place in gaseous plasma in plasma reactors. Films are grown by synthesizing from gases, often at lowered pressures, in so-called CVD (Chemical Vapour Deposition) or LPCVD (Low Pressure Chemical Vapour Deposition) reactors. In addition, increasingly often, instead of standard circuits for general use, Application Specific Integrated Circuits (ASIC) or the client's own full- or semi-custom integrated circuits are produced, where series are small and the processing of one wafer at a time, as described in the present invention, may suffice.

Especially in teaching and research use in universities and many research institutes where there is no need for serial production, it suffices to handle one wafer at a time and to carry out the different stages of the processing sequentially, that is, in succession in different reactors.

In order to be able to study, for example, the production of integrated circuits or various detectors and sensors in as versatile a manner as possible, reactors of very different types are required. The number of reactors required can be minimized by designing each reactor to operate within as wide a range as possible. In modern semiconductor technology, reactors are required, for example, for the following types of processes:

Epitaxial growth of silicon and growth of polysilicon.

The epitaxial growth of silicon under low pressure requires a temperature of 500–800° C., which is produced, for example, by resistive heating. A graphite sheet may be used as the heating element. The maximum temperature of the reactor is about 1100° C., the growth pressure $10^{-4}$–10 mbar (0.01–1000 Pa); the gases used are hydrogen, nitrogen and silane $SiH_4$ or disilane $SiH_2Cl_2$ and a doping gas.

Predeposition. The maximum temperature of the reactor is about 1100° C.; the gases used are nitrogen, oxygen and, as doping gas, for example, phosphine, diborane or arsine.

Oxidation and diffusion. The maximum temperature of the reactor is about 1100° C.; the gases used are nitrogen and oxygen and water vapour. The reactor may have to withstand a pressure of up to 20 atm.

LPCVD growth. The maximum temperature of the reactor is about 600° C. and the negative pressure about 50 mbar; the gases used are nitrogen, oxygen and e.g. silane, ammonia vapour, aluminium and tungsten alloys.

Plasma etching. Process pressure <0.2 mbar and RF frequency e.g. 13.56 MHz; the gases used are e.g. $CF_4$ or $CCl_4$, and oxygen and hydrogen.

Metal deposition under vacuum e.g. by sputtering. The maximum temperature of the reactor is about 300° C. and the process pressure about 0.001–0.5 mbar. The reactor incorporates an aluminium or other metal cathode.

Very different types of reactors are thus required to be able to carry out versatile research: reactors that withstand a vacuum or pressure, high temperatures or a corrosive gaseous atmosphere. For example, in the first three processes mentioned above, high temperatures make great demands on reactors. In the apparatus relating to the invention, a considerable number of different types of reactors can be combined, each of which is tailor-made only for a specific processing stage. On the other hand, the apparatus can obviously be made to consist of reactors operating within a wider range, in which case correspondingly fewer separate reactors are required. For example, the same reactor could possibly be used for epitaxial growth, predeposition, oxidation and LPCVD growth, but the pressure, temperature and gaseous atmosphere are adjusted each time to meet the requirements of the processing stage in question.

The structure and material of the reactors must be such that the required processing stages can be carried out in each of them reliably, cleanly and without subjecting the wafer being processed to thermal stress. In designing reactors for research use it may be presumed that the wafers have a diameter of 150 mm and lie flat in the reaction chambers with the active side up, in which case the diameter and height of the reaction chambers will range between 250–300 mm, depending on the maximum temperature. Stainless steel is a suitable material for reaction chambers in which a vacuum is required. Quartz and possibly an insulating outer covering which reflects heat must be used in the reaction chambers operating at the highest temperatures. The chamber may also be water-cooled.

In the apparatus relating to the invention, completely different types of reactors intended for processing silicon wafers can now be combined in an advantageous manner. Since the reactors operate in succession, they may be connected in turn to the reactors' common gas extraction, that is, vacuum system and common gas feed and regulation system and each reactor does not require separate systems as was the case before. In the apparatus relating to the invention, the high vacuum created for the duration of the waiting period ensures purity and prevents the gases from different processing stages from entering in the wrong reactor.

Considerable savings result from the use of the common central unit in comparison to previously known apparatuses, in which each different type of reactor used its own vacuum system and gas feed and control system, which constitute a major part of the total price of the apparatus.

The apparatus relating to the invention is also extremely compact and it requires little space compared to systems in which each reactor has its own vacuum, gas distribution, electricity distribution, automation and gas extraction systems. When ready for operation, the apparatus relating to the invention fits into a 20–30 $m^2$ size room. An apparatus comprising three different reactors only requires a space of about 1 m×3 m×1.5 m, which means considerable saving of space compared to known systems.

The apparatus relating to the invention is intended primarily for the type of use in research and teaching, where the aim is to process silicon wafers in prototype fashion and to examine the different stages of processing, and where it is usually necessary to handle only one silicon wafer at one processing stage at a time. The apparatus relating to the invention can be set successively from the central unit to a state where only the reactor involved in the processing stage being examined at a given time is in operation and in contact with the devices controlling operation. The other reactors are at the waiting stage but can in turn be connected by means of valves and switches to the devices controlling operation.

The entire system is typically kept under a continuous vacuum. The reactors are connected to the connecting pipe of the common vacuum system and a high vacuum is created in the reactors by opening the vacuum valves between the reactors and the connecting pipe. After this, the reactors under a high vacuum and remaining at the waiting stage during processing are cut off from the system by means of vacuum valves, these reactors thus remaining under high vacuum for the duration of the entire waiting stage. Maintaining the high vacuum in the reactors during the waiting period ensures purity in the system.

After this, pressure in the reactor to be activated is increased to the level required by the processing. Pressure is regulated by adjusting the suction power of the turbo pump of the vacuum system, for example, by means of a throttle valve. The negative pressures or pressures required at the different processing stages vary to a great extent from one processing stage to another. The activated reactor is in direct contact with the turbo pump through the connecting pipe, which means that the pressure in the connecting pipe is always lower or—at its highest—the same as that in the activated reactor and thus there will be no gas flow from the connecting pipe to the reactor.

The apparatus relating to the invention, comprising two or more reactors and a common central unit, obviously also requires external patterning, that is, so-called masking equipment and possibly optical and electrical measuring instruments. Wet scrubbing is preferably also carried out outside the apparatus.

BRIEF DESCRIPTION OF THE DRAWINGS

The invention is described in greater detail in the following with reference to the appended drawings, in which.

DETAILED DESCRIPTION OF THE DRAWINGS

Figure 1:
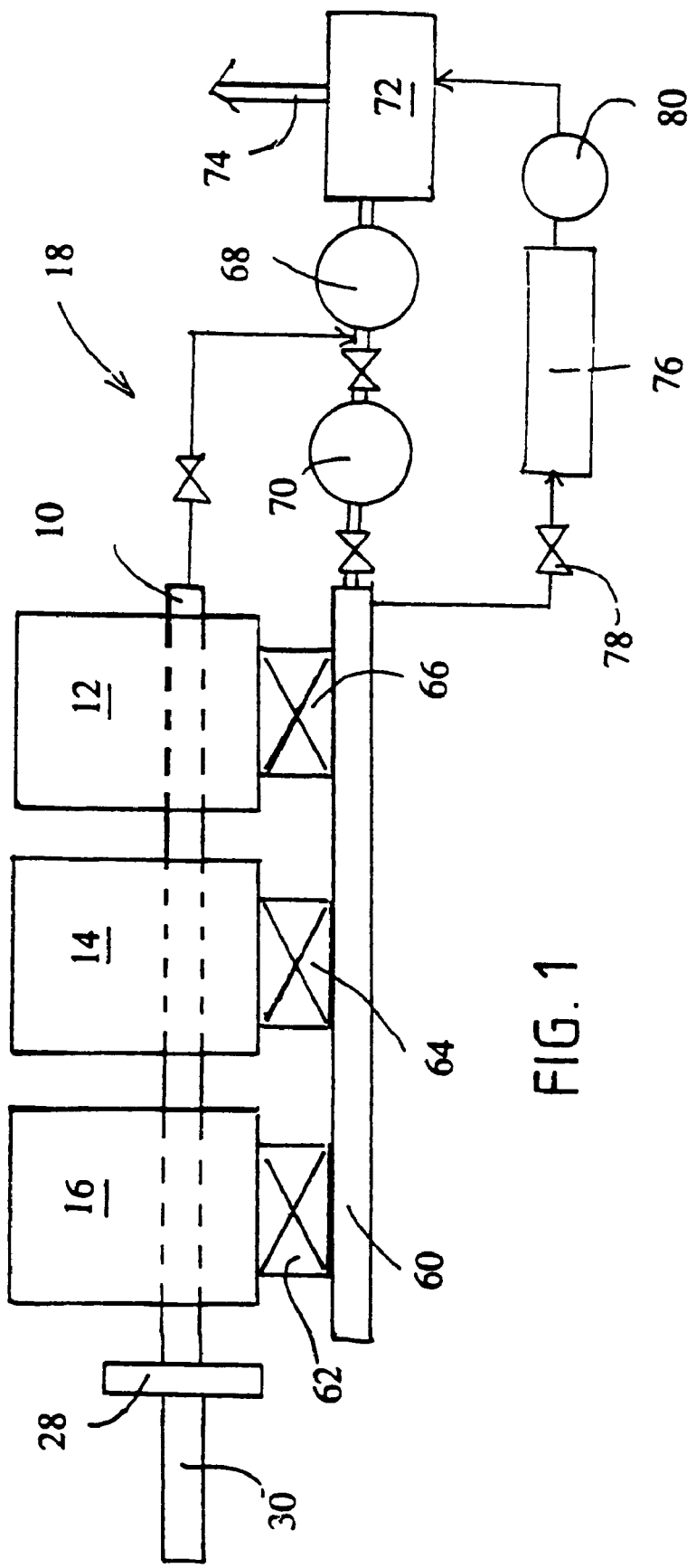
FIG. 1 shows a diagrammatic side view of the silicon wafer processing apparatus comprising the central unit relating to the invention.
Figure 2:
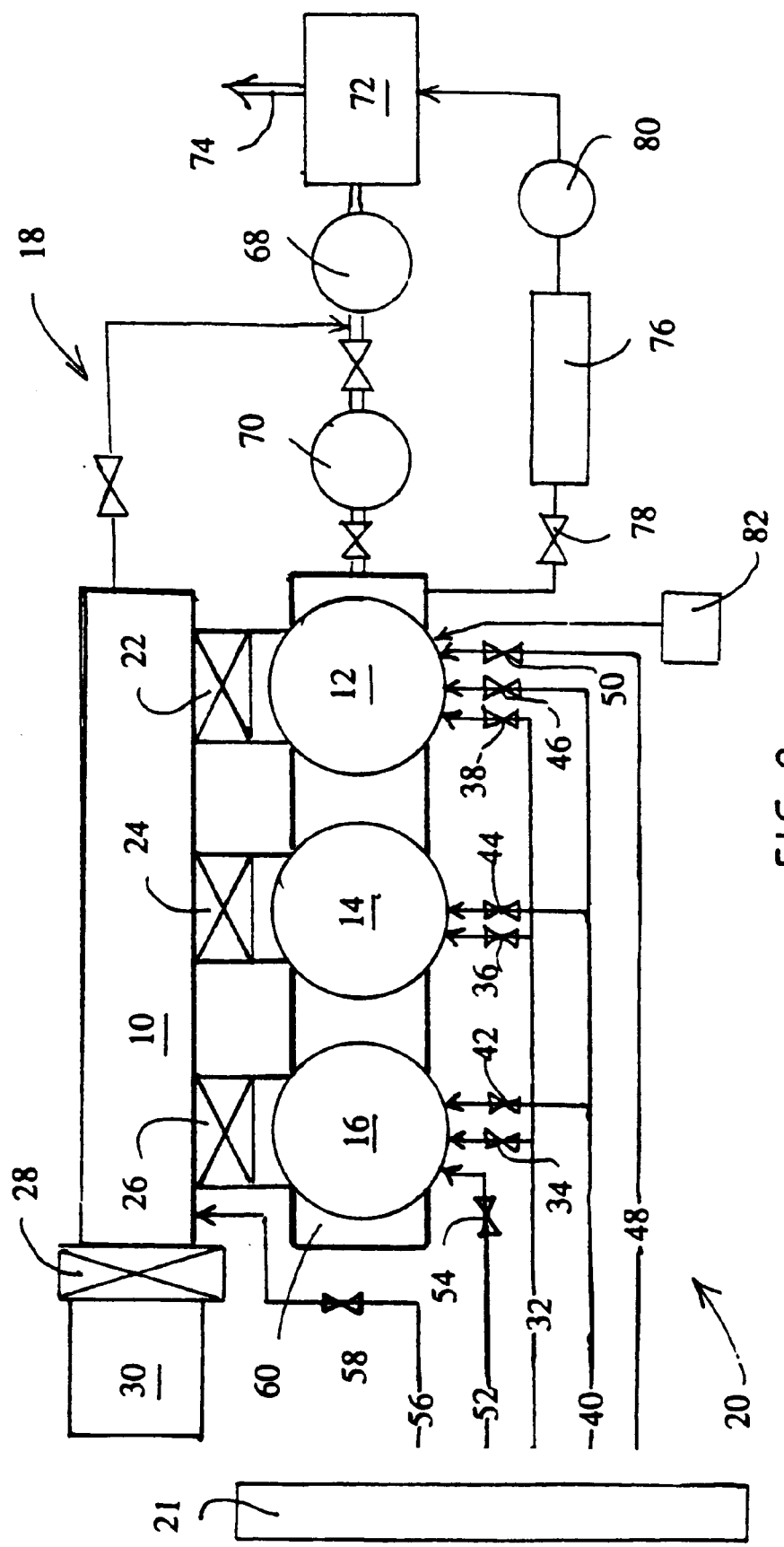
FIG. 2 shows the apparatus of FIG. 1 as seen from above.

FIGS. 1 and 2 show the silicon wafer processing apparatus relating to the invention which comprises a wafer loading chamber 10, three adjacent reactors 12, 14 and 16 for the actual processing of the silicon wafers, and the vacuum pump system 18 belonging to the reactors' common central unit for creating a vacuum in the reactors and the silicon wafer loading chamber, and a gas distribution system 20 and a control unit 21. In the figures, the vacuum pump system 18 is shown as arranged adjacent to the reactors 12, 14, and 16, but in reality it is preferably arranged below the reactors.

As seen in FIG. 2, the silicon wafer loading chamber 10 is connected by means of the seals 22, 24 and 26 acting as pressure valves with the reactors 12, 14 and 16. A cassette 30, intended for conveying and storing the silicon wafer, can in addition be connected to the loading chamber by means of a seal 28, in which cassette the wafer is conveyed and stored flat, in a horizontal position, with its active side up, and through the glass cover of which, for example, oxide growth on the wafer can be seen.

As processing begins, the silicon wafer is transferred from the conveying and storage cassette 30, preferably by means of an automatic wafer-transfer mechanism (not shown in the figures), through the seal 28, the loading chamber 10 under negative pressure or vacuum, and through a second seal 22, 24 or 26 to the reaction chamber of the reactor 12, 14 or 16 to be activated at a given time.

The silicon wafer transfer mechanism comprises a carriage-like construction and quartz rails fitted in the loading chamber which together, in a guided and controlled fashion, transfer the wafer from the external storage space to the reactor, from one reactor to another or from a reactor to the external storage space. The transfer from one reactor to another is carried out under vacuum (about $10^{-3}$–$10^{-4}$ mbar).

The two-stage transfer of the silicon wafer through a loading chamber under negative pressure or vacuum to the reaction chamber, as described above, isolates the reaction chamber efficiently from the outside atmosphere and thus helps to keep the reaction chamber clean.

The reactors 12, 14 and 16 differ from each other and are suited for use at different processing stages. In the embodiment shown in FIGS. 1 and 2, reactor 12 is used for plasma etching, reactor 14 for sputtering or metal deposition, and reactor 16 for epitaxial or CVD growth. In the waiting state the reactors are under a high vacuum. The reactors 12, 14 and 16 are connected to the gas distribution system 20 in which gas pipelines conduct the gas needed at a given time to the reactors and, if necessary, also elsewhere, for example, to the loading chamber. Thus, for example, in FIG. 2, the gas pipe 32 conducting oxygen is connected by means of valves 34, 36 and 38 to the reactors 12, 14, 16. Similarly, the gas pipeline 40 conducting argon, nitrogen and hydrogen is connected by means of valves 42, 44 and 46 to the reactors 12, 14, 16. The gas pipeline 48 conducting argon, carbon tetrafluoride ($CF_4$) or carbon tetrachloride ($CCl_4$) is connected by means of a valve 50 only to the plasma etching reactor 12. The gas pipeline 52 conducting argon, diborane ($B_2H_6$), arsine ($AsH_3$) or silane ($SiH_4$) is connected by means of a valve 54 only to the epitaxial or CVD reactor 16. The gas pipe 56 conducting nitrogen is connected by means of a valve 58 to the loading chamber 10. Nitrogen is also used for venting the reaction chambers, the loading chamber and the pumps, and for controlling the pneumatic valves. It should preferably be possible to pressurize the gas pipelines to a pressure of 15–20 bar. All gas valves can be controlled automatically from the control unit 21 connected to the central unit, the control unit having connections (not shown) to the above-mentioned valves.

The vacuum equipment 18 connected to the central unit comprises a connecting pipe 60 connected to the reactors 12, 14 and 16 by means of vacuum valves 62, 64 and 66. A mechanical pump 68 and a turbo pump 70 are connected to the connecting pipe 60 and by means of them, the desired negative pressure or vacuum can be created in the connecting pipe and reactors, when the valves are open. The suction power of the turbo pump is regulated by means of a throttle valve. By regulating suction power, it is possible to stabilize the pressure in the reaction chamber in use at any given time.

The gases discharged during the processing stage by means of pumps from the reactor 12, 14, or 16 which is in operation, are preferably conducted, as shown in FIGS. 1 and 2, to the combustion unit 72, where the combustible toxic gases are destroyed, after which the gases can be discharged from the apparatus through an outlet 74. If desired, the gases may of course be directed past the turbo pump 70 and/or the mechanically operating pump 68. In the solution shown in FIGS. 1 and 2 the gas combustion unit 72 and the pumps are arranged after the connecting pipe 60, but may, if desired, obviously be fitted on either side of the connecting pipe or below the connecting pipe, depending on where the most space is available.

The gas distribution system 20 is preferably also connected to the gas discharge system, for example, to the combustion unit 72 so that the gas flowing through the gas pipeline 20 can be safely discharged. The gas pipelines 32, 40, 48, 52 and 56 can thus be connected, for example, to the combustion unit 72 by means of separate gas pipes, not shown in FIGS. 1 and 2.

Various gas measuring and testing devices, such as a mass spectrometer 76 for measuring the partial pressures of various gas combinations, can also be connected to the connecting pipe 60 of the apparatus. The mass spectrometer is connected by means of a valve 78 to the connecting pipe 60 and, for example, through a pump 80 to the combustion unit 72, where the tested gases can be destroyed. The common connecting pipe allows common analysis of the gases.

In the apparatus relating to the invention, only one reactor is in operation at a time. If, in the apparatus relating to FIGS. 1 and 2, for example the epi-reactor or the oxidation reactor 16 is in operation, the valves 64 and 66 between the other reactors, that is, the plasma etching reactor 12 and the metal deposition reactor 14, and the connecting pipe 60 must be closed.

The gas valves 36, 38, 44, 46, 50 between the reactors 12 and 14 and the gas pipeline are also closed and no gas is conducted to the reactors. The apparatus operates as if it comprised only one active reactor 16 and the functions required by that reactor. The apparatus, therefore, operates like previously known apparatuses, where each reactor had separate vacuum, gas and electricity systems. In the epitaxial reactor 16, a thin oxide layer is grown on the surface of the silicon wafer while heating the wafer at the same time. The gas valves 34, 42, 54 are open and the gas required for the processing of the epitaxial reactor is conducted from the gas pipelines 32, 40 and 52. All gas valves are closed and regulated from the control unit 21.

When the desired processing stage, that is, the oxide growth has been carried out in the apparatus shown in FIGS. 1 and 2, the wafer is removed from the reactor 16 and the required patterning is done on it outside the apparatus. The gas valves of the gas pipelines leading to the reactor 16 are closed and a high vacuum is created in the reactor.

After patterning the wafer is returned to the apparatus for further processing. The wafer may then be placed, for example, for plasma etching in reactor 12, where the pressure is allowed to rise to a suitable level and where the gas valves 38, 46, 50 are opened to establish a suitable gaseous atmosphere. In this case, therefore, only reactor 12 is active in its turn, and the other reactors 14 and 16 have been cut off from the central unit, that is, from the vacuum system 18, the gas distribution system 20 and the electricity system. For plasma etching the reactor 12 incorporates the electrodes required for the processing with their support structures (not shown in figures). The gases required for processing are conducted to the vacuum chamber by means of the gas pipelines 32, 40 and 48. The high-frequency alternator intended for firing the plasma in the reactor 12 is powered by the power supply 82. The maximum starting power of the alternator is, for example, about 500 W when the frequency is 100 kHz, thus corresponding to LF plasma.

Similarly, for example, in metal deposition on a wafer in the sputtering chamber in reactor 14, the other reactors 12 and 16 are cut off from the system. The sputtering chamber can be made, for example, of aluminium. The basic structure of the chamber is similar to that of other chambers as far as the entrance for the silicon wafer is concerned. A magnetron is mounted in the upper part of the chamber, and a target is fixed to the magnetron. The magnetron may be provided with permanent magnets or electromagnets. The magnetron can be isolated from the sputtering chamber by means of a valve while the target is being changed.

According to the invention, all the reactors, that is, processing chambers are preferably under a high vacuum during the waiting period, for example, under a vacuum of about 10–100 Pa ($10^{-3}$–$100^{-4}$ bar). Also the loading chamber of the apparatus, through which the wafer is transferred from the closed cassette into the processing chamber, is pumped to a state of vacuum before the transfer of the wafer. By transferring the wafer from the loading chamber into the processing chamber under a high vacuum, the amount of impurities transferring into the processing chamber with the wafer can be reduced to a fraction of what they would be if the transfer took place under normal air pressure. The pressure in the processing chamber to be activated at a given time is not increased to operating pressure until the processing begins. Thus the reactions take place under extremely clean conditions. All the wafer transferring stages should in fact take place in as clean conditions as possible.

It should be understood that the invention is not limited to the foregoing embodiment, but may be applied within the scope of the inventive idea defined in the claims below.

I claim:

1. Apparatus for processing silicon wafers, comprising:
   two or more different reactors for practicing distinctly different processing stages in the production of silicon wafers;
   vacuum equipment, including a pump, common to said reactors, and connected to each of said reactors by a plurality of conduits, one for each reactor, and a plurality of vacuum valves, one disposed in each said conduit, each vacuum valve being separately controllable to connect or disconnect one of said reactors to or from said common vacuum equipment;
   a gas distribution system common to said reactors, and comprising at least one source of treatment gas connected to each of said reactors by a gas pipe with a gas valve in said gas pipe, each gas valve being separately controllable to connect or disconnect a said source of gas to or from one of said reactors; and
   a control unit for controlling said gas valves to selectively connect or disconnect each reactor to or from a said source of gas.

2. Apparatus as recited in claim 1 wherein said vacuum equipment pump comprises a turbo pump.

3. Apparatus as recited in claim 1 further comprising a common silicon wafer loading chamber for loading a silicon wafer being processed to the desired one of said reactors, said loading chamber connected to said vacuum equipment so that a negative pressure may be provided in said loading chamber.

4. Apparatus as recited in claim 1 further comprising an electricity distribution system, including a high-frequency alternator, common to said reactors.

5. Apparatus as recited in claim 1 wherein each of said reactors comprises a processing chamber for a single silicon wafer.

6. Apparatus as recited in claim 1 wherein said pump comprises a vacuum pump.

7. Apparatus as recited in claim 6 wherein said vacuum equipment further comprises a turbo pump.

8. Apparatus as recited in claim 1 wherein said two or more reactors comprise at least two of the reactors selected from the following group: an epitaxial growth of silicon reactor, a plasma etching reactor, and a metal deposition under vacuum reactor.

9. Apparatus as recited in claim 8 wherein said two or more reactors comprises an epitaxial growth of silicon reactor, a plasma etching reactor, and a metal deposition under vacuum reactor.

10. Apparatus as recited in claim 8 further comprising a common silicon wafer loading chamber for loading a silicon wafer being processed to the desired one of said reactors, said loading chamber connected to said vacuum equipment so that a negative pressure may be provided in said loading chamber.

11. Apparatus as recited in claim 10 further comprising an electricity distribution system, including a high-frequency alternator, common to said reactors.

12. Apparatus as recited in claim 11 wherein each of said reactors comprises a processing chamber for a single silicon wafer.

13. A method for processing silicon wafers using two or more different reactors, comprising the steps of:
   (a) providing one or more silicon wafers to be processed to a first, active reactor while the other reactors are maintained dormant, so that only a single reactor is active at a time;
   (b) connecting the first, active, reactor to a common source of vacuum;
   (c) supplying a gas treatment containing one or more of oxygen, nitrogen, argon, hydrogen, CF4, CCl4, silane, diborane, arsine and phosphine to the first, active, reactor to treat the one or more silicon wafers in the first, active, reactor to produce processed silicon wafers;
   (d) at spaced points in time transferring the treated silicon wafers from the first reactor to a second of the two or more reactors;
   (e) providing the second reactor as the single active reactor by practicing steps (b) and (c) therewith;
   (f) maintaining dormant reactors under vacuum; and
   (g) practicing distinctly different processing stages in step (b) and step (c) in the second reactor than in the first reactor.

14. A method as recited in claim 13 wherein steps (b) through (e) are practiced to effect two or more of epitaxial growth of the silicon wafer or wafers, plasma etching of the wafer or wafers, and vacuum metal deposition of the wafer or wafers.

15. A method as recited in claim 13 wherein step (d) is practiced under a vacuum of between about $10^{-3}$–$10^{-4}$ mbar.

16. A method as recited in claim 13 wherein step (b) is practiced to disconnect the other reactor, besides the first, active, reactor, from the source of vacuum.

17. A method as recited in claim 13 wherein step (f) is practiced to maintain dormant reactors under a vacuum of between about 10–100 Pa.

18. A method as recited in claim 17 wherein steps (b) through (e) are practiced and repeated so as to subject each silicon wafer to epitaxial growth, plasma etching, and vacuum metal deposition.

19. A method as recited in claim 18 wherein step (b) is practiced to disconnect the other reactor, besides the first, active, reactor, from the source of vacuum; and wherein step (d) is practiced under a vacuum of between about $10^{-3}$–$10^{-4}$ mbar.

20. A method for processing silicon wafers using two or more different reactors, comprising the steps of:
   (a) providing one or more silicon wafers to be processed to a first, active reactor while the other reactors are maintained dormant, so that only a single reactor is active at a time;
   (b) connecting the first, active, reactor to a common source of vacuum;
   (c) supplying a gas treatment containing one or more of oxygen, nitrogen, argon, hydrogen, CF4, CCl4, silane, diborane, arsine and phosphine to the first, active, reactor to treat the one or more silicon wafers in the first, active, reactor to produce processed silicon wafers;
   (d) at spaced points in time transferring the treated silicon wafers from the first reactor to a second of the two or more reactors;
   (e) providing the second reactor as the single active reactor by practicing steps (b) and (c) therewith;
   (f) maintaining dormant reactors under vacuum; and
   wherein steps (b) through (e) are practiced and repeated so as to subject each silicon wafer to epitaxial growth, plasma etching, and vacuum metal deposition.

* * * * *